United States Patent [19]

Odashima et al.

[11] Patent Number: 5,484,648
[45] Date of Patent: Jan. 16, 1996

[54] HEAT-SEALABLE CONNECTOR AND METHOD FOR THE PREPARATION THEREOF

[75] Inventors: Satoshi Odashima; Kazuyoshi Yoshida, both of Saitama, Japan

[73] Assignee: Shin-Etsu Polymer Co., Ltd., Tokyo, Japan

[21] Appl. No.: 105,731

[22] Filed: Aug. 11, 1993

[51] Int. Cl.⁶ ............................................... B32B 9/00
[52] U.S. Cl. ................... 428/209; 428/320.2; 428/323; 428/324; 428/327; 428/346; 428/347
[58] Field of Search ........................... 428/209, 320.2, 428/323, 327, 324, 346, 347

[56] References Cited

U.S. PATENT DOCUMENTS

| | | | |
|---|---|---|---|
| 4,250,398 | 2/1981 | Ellis et al. | 428/323 |
| 4,313,995 | 2/1982 | Delgadillo | 428/320.2 |
| 4,731,282 | 3/1988 | Tsukagoshi et al. | 428/323 |
| 4,808,470 | 2/1989 | Geuskens et al. | 428/323 |
| 4,931,598 | 6/1990 | Calhoun et al. | |

FOREIGN PATENT DOCUMENTS

| | | |
|---|---|---|
| 55-029598 | 8/1980 | Japan |
| 8606551 | 11/1986 | WIPO |

*Primary Examiner*—Patrick J. Ryan
*Assistant Examiner*—Kam F. Lee
*Attorney, Agent, or Firm*—McAulay Fisher Nissen Goldberg & Kiel

[57] ABSTRACT

Proposed is an improved heat-sealable connector having aligned lines of an electroconductive paste formed by screen printing on the surface of a flexible substrate. Different from conventional heat-sealable connectors, the electroconductive lines are not formed directly on the surface of the substrate but the substrate surface is first provided with a layer of a solvent-absorptive material and the electroconductive lines are formed on the solvent absorptive layer by screen printing so that the screen-printed lines of the paste never cause running to broaden the line width by virtue of immediate absorption of the solvent in the paste into the solvent-absorptive layer to contribute not only to the productivity but also to the quality of the product connectors.

13 Claims, 2 Drawing Sheets unit: mm

HEAT-SEALABLE CONNECTOR AND METHOD FOR THE PREPARATION THEREOF

BACKGROUND OF THE INVENTION

The present invention relates to a heat-sealable connector used for making electrical connection between arrays of electrode terminals on an electronic display device such as liquid crystal display units, electroluminescence display units, light-emitting diodes, electrochromic display units, plasma display units and the like and a circuit board mounting the driving circuit therefor or between electrode terminal arrays on two electric circuit boards as well as to a method for the preparation thereof.

As is known, heat-sealable connectors are widely used heretofore for establishing electrical connection between an electronic display unit such as those mentioned above and a circuit board mounting a driving circuit therefor including rigid and flexible printed circuit boards or between two circuit boards.

Along with the trend in recent years in the technology of electronic display technology toward more and more increased size of the display screens, sixfit from monochrome displays to colored displays and increased fineness of the picture elements, the number of the electric circuits on various circuit boards to be electrically connected by using heat-sealable connectors is also rapidly increasing. Accordingly, a single heat-sealable connector is required to contain as many as 100 to 700 electroconductive lines which can be achieved only with a decrease in the width of each of the electroconductive lines and pitch of the arrangement thereof. For example, the requirement in this regard is that the width of each of the electroconductive lines is from 0.07 to 0.15 mm and the pitch of the arrangement thereof is from 0.15 to 0.30 min. While the most conventional method for the formation of an electroconductive line pattern on heat-sealable connectors and the like is the method of screen printing with an electroconductive paste or ink, difficulties are also increasing so much in forming an electroconductive line pattern by the screen printing method.

To explain in more detail, an electroconductive line pattern is formed by the screen printing method by using an electroconductive paste containing fine electroconductive particles dispersed in an organic resinous binder and, in conducting the screen printing on a substrate surface, the layer of an electroconductive paste applied to a fine-mesh printing screen, which is a plain- or diagonal-woven fabric of fine filaments having a diameter of about 10 to 30 μm, is first divided by the filaments or wires and the crossing points thereof to fill the mesh openings into tiny portions which are extruded out of the mesh openings and transferred to the substrate surface where the tiny portions are conjoined together to form a line pattern of the electroconductive lines followed by lifting of the printing screen from the substrate surface.

It is an unavoidable phenomenon in the lifting of the printing screen that a shearing movement is caused between the screen meshes and the layer of the electroconductive paste on the substrate surface so that the consistency of the paste is thixotropically decreased resulting in the phenomenon of so-called running of the paste to increase the width of the patterned lines sometimes by 30 to 50 μm as compared with the width of the openings in the printing screen. Needless to say, this phenomenon is very detrimental when a very fine electroconductive line pattern is desired on the substrate surface due to eventual short-circuiting between adjacent lines. Attempts to solve this problem have been directed mainly toward improvement in the theological properties of electroconductive pastes by increasing the viscosity or by modifying the thixotropic behavior of the paste and improvement of the formulation of the paste so that the consistency of the paste is rapidly increased immediately after printing on the substrate surface so as to prevent the paste from running on the substrate surface. These measures to modify the theological properties of the electroconductive paste naturally have limitations relative to the selection of the ingredients of the paste and unavoidable decrease in the printability with the paste resulting in a decreased printing velocity and eventual line break in the printed line pattern. A countermeasure conventionally undertaken is to have a mesh opening of the printing screen having a width smaller by 30 to 50 μm than the desired line width and to conduct printing with an electroconductive paste of a relatively low consistency with good printability so that the printed lines may have a width just as desired even after the unavoidable broadening by the phenomenon of running of the paste after printing.

When the alignment pitch of the electroconductive lines is as small as 0.15 to 0.30 mm, the above mentioned method of using a printing screen of downsized mesh openings is no longer applicable because the width of the mesh openings must be so small with a relatively large proportion of the downsizing resulting in poor penetrability of the electroconductive paste through the printing screen eventually to cause line break of the electroconductive lines on the substrate surface. Thus, this method is under a limitation relative to the alignment pitch of the electroconductive patterned lines.

Moreover, the above mentioned problem relative to the limit in the alignment pitch of the electroconductive lines is greater when, instead of a conventional electroconductive paste compounded with very free electroconductive particles, the electroconductive lines are formed from a paste compounded with electroconductive particles having a relatively large particle diameter with an object to obtain anisotropic electroconductivity because such large particles can hardly penetrate the fine mesh openings.

As is described above, heat-sealable connectors prepared by the method of screen printing cannot be free from fatal defects when the electroconductive line pattern is so fine in compliance with the requirements in recent electronic devices as to cause a decrease in the penetrability of the electroconductive paste through the printing screen eventually resulting in occurrence of constrictions or break points in the electroconductive lines. When the line width of the electroconductive lines is not so small as to balance with the small pitch of the line alignment, troubles due to direct short-circuiting between adjacent electroconductive lines may eventually be caused as a result of running of the electroconductive paste or, even if this is mot the case, troubles are sometimes unavoidable due to displacement of the electroconductive lines caused by inaccurate positioning of the heat-sealable connector in the assemblage of the electromic device or accumulated displacement of the electroconductive line pattern per se also resulting in short-circuiting.

Furthermore, the above mentioned method by using a printing screen of a downsized mesh opening must be accompanied by a troublesome procedure for the adjustment of the consistency of the electroconductive paste and/or modification in setting of the printing conditions. These modifications in the manufacturing conditions heat-sealable connectors are more or less responsible for various troubles such as an undesirably great increase in the line width of or blurr or running in the electroconductive patterned lines as a consequence of an excessively large volume of the supply of the electroconductive paste due to mismatching between the consistency of the electroconductive paste and the printing conditions not to ensure reliable insulation between adjacent electroconductive lines or, to the contrary, when supply of the electroconductive paste goes short, a complete electroconductive line pattern without line break can hardly be obtained so that no good production efficiency can be obtained by the method of screen printing. Much less, the method of screen printing is not applicable to patterning of electroconductive lines in heat-sealable connectors when the alignment pitch of the electroconductive lines is 0.20 mm or smaller.

SUMMARY OF THE INVENTION

A primary object of the present invention is to provide a method for the formation of an extremely fine pattern with a solvent-containing paste composition by screen printing on the surface of a substrate having no absorptivity of organic solvents.

The present invention accordingly has a further object to provide a novel heat-sealable connector having patterned electroconductive lines aligned sharply and finely with a pitch of as small as 0.10 to 0.20 mm, which cannot be obtained industrially by the prior art method of screen printing as well as to provide a method for the preparation of such an improved headsealable connector freed from the above described problems and disadvantages in the prior art.

Thus, the method as the primary object of the present invention for the formation of an extremely fine pattern with a solvent-containing paste composition by screen printing on the surface of a substrate having no absorptivity of organic solvents comprises, prior to the screen printing with a solvent-containing paste composition, forming a layer of a material capable of absorbing the solvent on the surface of the substrate.

The heat-sealable connector of the invention comprises, as an integral body:

(a) a substrate having flexibility;

(b) a layer of a solvent-absorptive material formed at least a part of the surface of the substrate;

(c) lines of an electroconductive paste aligned substantially in parallel to each other on the layer of the solvent-absorptive material; and (d) a layer of a heat-sealable, anisotropically electroconductive paste formed on the lines of the electroconductive paste.

The method of the present invention for the preparation of the above defined heat-sealable connector comprises the steps of:

(A) coating at least a part of the surface of a flexible substrate with a coating composition of a solvent-absorptive material to form a solvent-absorptive layer;

(B) forming lines of an electroconductive paste substantially in parallel to each other by screen printing on the solvent-absorptive layer; and (C) coating at least a part of each of the electroconductive lines with an anisotropically electroconductive adhesive composition.

In particular, it is preferable that the ingredient in the composition forming the above mentioned solvent-absorptive layer and the ingredient in the electroconductive paste each have functional groups reactive with those in the other composition or paste so that chemical bonds can be formed between the solvent absorptive layer and the electroconductive lines.

DETAILED DESCRIPTION OF THE PREFERRED EMBODIMENTS

Figure 1:
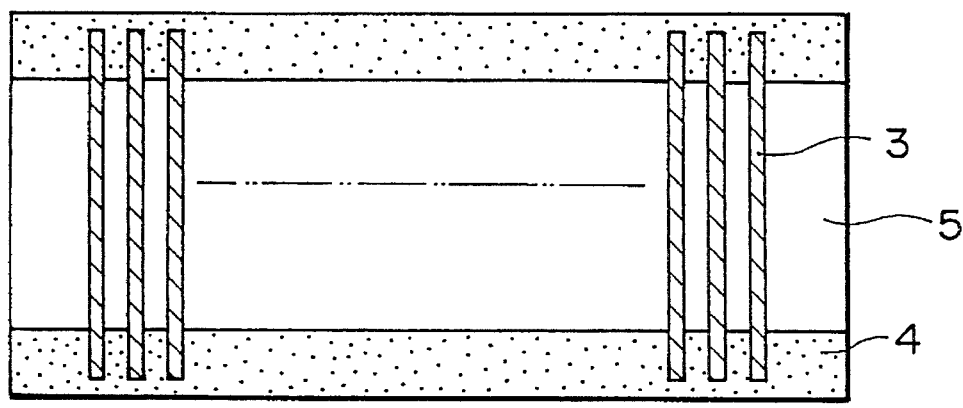
FIG. 1 is a plan view of the heat-sealable connector of the invention.

As is described above, the heat-sealable connector of the present invention comprises the essential constituents of (a), (b), (c) and (d), of which the most characteristic is the solvent-absorptive layer (b) intervening between the substrate surface and the electroconductive line pattern formed from an electroconductive paste by screen printing. FIG. 1 of the accompanying drawing schematically illustrates a typical heat-sealable connector of the invention by a plan view. As is shown in this figure, the flexible substrate 1 is coated all over the surface with a layer 2 of a solvent-absorptive material and the electroconductive lines 3 are formed thereon with an electroconductive paste. Thereafter, the end portions of the electroconductive lines 3, hereinafter referred to as the connecting zone, is coated with an anisotropically electroconductive adhesive forming an adhesive layer 4 while the remaining areas are coated with an electrically insulating resist layer 5.

This unique structure of the heat-sealable connector of the invention has been established as a result of the extensive investigations undertaken by the inventors directing their attention to the relationship between the content of the organic solvent contained in the electroconductive paste used in the screen printing for the formation of the electroconductive line pattern and the viscosity thereof as well as to the rheological behavior of the electroconductive paste in the lapse of time after the paste is extruded out of the mesh openings of the printing screen on to the underlying surface. In the course of the investigations, the inventors have come to an idea that, when the screen printing with a solvent-containing electroconductive paste is conducted on the surface of a solvent-absorptive layer formed on the substrate surface, the organic solvent contained in the paste would be instantaneously absorbed in the solvent-absorptive layer so that the paste formed in a line pattern is imparted with a rapidly increasing viscosity or consistency so as not to cause the phenomenon of running giving a finely and sharply patterned line of the paste having a width which is not substantially larger than the width of the mesh opening of the printing screen from which the electroconductive paste is extruded even when the electroconductive paste used for the screen printing has a relatively low viscosity by the admixture of an organic solvent with an object to improve the printability.

Figure 2:
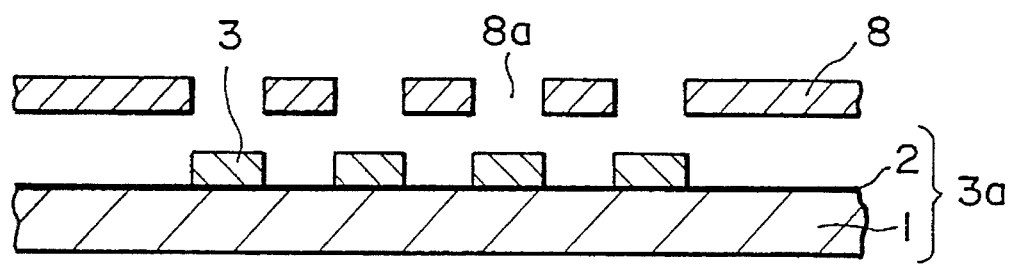
FIG. 2 is for illustration, by a cross sectional view, of the step for the formation of the electroconductive lines by screen printing.

To explain the process for the preparation of the inventive heat-sealable connector in more detail by making reference to FIG. 2, the surface of a substrate 1 is first coated with a coating composition containing a solvent-absorptive material to form a solvent-absorptive layer 2 having a thickness of, preferably, from 0.1 to 50 μm after drying, which readily absorbs the solvent constituent contained in the electroconductive paste. It is not always necessary that the solvent-absorptive layer 2 is formed on all over the surface of the substrate 1 but it is sufficient that the solvent-absorptive layer 2 is formed only on the areas on which the electroconductive lines 8 are formed in the subsequent step although the most convenient and efficient way is to conduct whole-surface coating. When the electroconductive lines 3 are formed by screen printing on the solvent-absorptive layer 2 with an electroconductive paste having a relatively low viscosity with admixture of an organic solvent, the solvent is instantaneously absorbed in the solvent-absorptive layer 2 to ensure fineness and sharpness of the printed line pattern 3.

According to the inventive method, namely, an electroconductive paste having a relatively low viscosity, which is desirable in order to obtain high productivity or printability, can be used so that the electroconductive paste can penetrate the printing screen 8 readily through the mesh openings 8a even when the size of the mesh openings 8a is extremely fine so as to comply with the recent requirement for a very free electroconductive line pattern 3 while the electroconductive paste reaching the underlying surface through the mesh openings 8a instantaneously loses the organic solvent contained therein by the absorption into the solvent-absorptive layer 2 so as to have a rapidly increasing viscosity not to cause running of the paste in the transverse direction of the lines and to give fine and sharp electroconductive lines 3 on the surface of the substrate 1.

The flexible substrate 1 on which the electroconductive line pattern 3 is formed according to the invention is not particularly limitative relative to the material including films of a polymeric resin having good heat resistance such as polyimide, polyethylene terephthalate, polycarbonate, polyphenylene sulfide, polybutylene terephthalate, polyethylene naphthalate, poly-1,4-cyclohexane dimethylene terephthalate, polyallylate, liquid-crystal polymers and the like. When good flexibility is desired, the polymeric film as the substrate should have a thickness in the range from 10 to 50 μm.

The solvent-absorptive material applied to the substrate surface to form a solvent-absorptive layer 2 thereon is not limitative depending on the nature of the electroconductive paste provided that the solvent-absorptive layer 2 may have a capacity to instantaneously absorb the organic solvent contained in the electroconductive paste forming the electroconductive lines 3 as the paste penetrating through the mesh openings 8a of the printing screen 8 has reached the solvent-absorptive layer 2. It has been experimentally found that the undesirable phenomenon of running of the electroconductive paste substantially does not take place when the viscosity of the paste is increased by at least 1.2 times by the absorption of the solvent within two seconds after the paste has reached the surface of the solvent-absorptive layer. In this regard, the solvent-absorptive material is selected from various polymeric resins having a solubility parameter which is not larger or not smaller by more than 2 than that of the organic solvent used for adjustment of the viscosity of the electroconductive paste and having a degree of crystallinity as small as possible. Examples of the solvent-absorptive resin include, for example, polyvinyl chloride resins, polyvinyl acetate resins, copolymers of vinyl chloride and vinyl acetate, polystyrene resins, acrylic resins, thermoplastic polyester resins, thermoplastic polyurethanes, polybutadienes, polyvinyl alcohols, polyvinyl butyral resins, polycarbonate resins, polyamide resins, polyimide resins, epoxy resins, alkyd resins, phenolic resins, unsaturated polyester resins, synthetic rubbers, e.g., polyisobutylene rubbers, polybutadiene rubbers, butyl rubbers, styrenebutadiene copolymeric rubbers, butadiene-acrylonitrile copolymeric rubbers and the like, as well as thermoplastic elastomers based on styrene, polyester, urethane, etc. and so on.

Although the solvent-absorptive polymeric resins can be either thermoplastic or thermosetting, it should be selected in consideration of various properties such as, besides the absorptivity to organic solvents as a matter of course, adhesion to the substrate surface, flexibility required for heat-sealable connectors, heat resistance not to cause deformation, crack formation and softening of the solvent absorptive layer at a temperature of 100° to 150° C. encountered in the course of drying and curing of the electroconductive paste forming the electroconductive lines thereon and resistance against organic solvents absorbed therein not to cause deformation and dissolution of the layer. In this regard, preferable ones among the above named various kinds of polymeric resins include copolymeric resins of vinyl chloride and vinyl acetate, thermoplastic polyester resins, thermoplastic polyurethane resins and epoxy resins, which, if necessary, can be admixed with a curing agent to effect crosslinking of the molecules such as isocyanate compounds, amine compounds, acid anhydrides, aldehydes and the like depending on the types of the polymeric resin, optionally, in combination with a known curing accelerator such as tertiary amine compounds, organometallic compounds and the like. Care should be taken not to select hygroscopic or ionic curing agents or curing accelerators which may be responsible for the migration of the fine metal particles contained m the electroconductive paste.

The solvent-absorptive materials of a particularly preferable class include combinations of a polymer having an active hydrogen-containing group such as hydroxy, amino, carboxyl, oxime and urea groups within the molecule or at the molecular chain terminals, e.g., phenolic resins, amino resins, epoxy resins, polyester resins, polyurethane resins, acrylic resins, polyamide resins, polyimide resins, natural rubber, butadiene-based rubbers, polychloroprone rubbers, polysulfide rubbers and the like, and an isocyanate compound, e.g., triphenylmethane triisocyanate, diphenylraethane diisocyanate, tolylene diisocyanate, hexamethylene diisocyanate and xylylene diisocyanate as well as adducts thereof with trimethylol propane or water, trimers thereof and so-called blocked isocyanates which are the reaction products of a di- or polyisocyanate compound having the isocyanato groups masked with a known masking agent. When such a solvent-absorptive polymeric material is used, the solvent-absorptive layer may have a possibility to form a chemical bonding with the constituent of the electroconductive paste described later to form electroconductive lines on the solvent-absorptive layer to increase the adhesive bonding strength therebetween resulting in an increased reliability of the electric connection with the inventive heat-sealable connector even under thermally or mechanically adverse conditions.

Since the stoichiometry of the reaction between the isocyanato groups and active hydrogen atoms is equimolar, it is possible to control the properties of the solvent-absorptive resin by adequately selecting the proportion of the polymeric ingredient and the isocyanate compound. When the amount of the isocyanate compound is smaller than equimolar, for example, a portion of the active hydrogen atoms in the polymeric ingredient is left unreacted een after completion of curing of the solvent-absorptive resin so that, when the electroconductive paste contains an isocyanato group-containing polymer and the isocyanato groups are net entirely consumed by the curing reaction of the paste, a reaction can take place between the remaining active hydrogen atoms in the solvent-absorptive layer and the remaining isocyanato groups in the electroconductive lines thus to improve the bonding strength therebetween.

In consideration of the mechanism of solvent absorption that the molecules of the organic solvent in the electroconductive paste must thrustingly enter between the resin molecules resisting the cohesive force of the polymeric molecules as being promoted by the good affinity between the polymeric resin and the solvent, the solvent-absorptive resin is preferably an amorphous one having an average molecular weight in the range from 2000 to 30000 or, preferably, from 5000 to 30000. It is preferable in order to improve the heat resistance and to decrease the surface tackiness of the solvent-absorptive layer that the solvent-absorptive resin is admixed with a finely divided reinforcing filler such as fumed or precipitated silica fillers, silicates, activated calcium carbonate and the like in an amount in the range from 0.1 to 10 parts by weight per 100 parts by weight of the solvent-absorptive resin. It is preferable that the particles of these inorganic fillers are surface-treated with a known coupling agent or rendered to have a porous surface in order to improve the compatibility between the filler particles and the organic polymer. When the surface of the solvent-absorptive layer has tackiness, troubles may be caused in the subsequent screen printing because the printing screen must be lifted against adhesion with the tacky surface of the solvent-absorptive layer eventually to cause blur or running of the electroconductive paste forming lines. Besides the addition of a finely divided filler, the heat resistance of the solvent absorptive layer can be improved by effecting three-dimensional crosslinking of the solvent-absorptive resin molecules while the molecular weight between two crosslinking points is desirably at least 2000 or, preferably, at least 20000 in order to obtain an appropriate value of the solubility parameter to ensure good affinity between the solvent-absorptive resin molecules and the solvent molecules. In this regard, when these requirements are taken into consideration, the most preferable solvent-absorptive resins include thermoplastic polyesters and thermoplastic polyurethanes.

The method for coating the substrate surface with the above described solvent-absorptive resin is not particularly limitative but can be conventional. Namely, the solvent-absorptive resin is dissolved in an organic solvent, which is not particularly limitative but, for example, can be the same one as the solvent used for the adjustment of the viscosity of the electroconductive paste, to give a solution of the resin, which is applied to the surface of the substrate by a known printing method such as screen printing, gravure printing and the like or a known coating method such as roller coating, bar coating, knife coating, spray coating, spin coating, dipping and the like. The coating layer of the solvent-absorptive resin thus formed is then dried and, if necessary, subjected to curing of the resin by heating at an appropriate temperature to give a substrate with a coating layer of the solvent-absorptive resin to be ready for screen printing of the electroconductive lines.

It is not always necessary that the solvent-absorptive layer is formed on all over the surface of the substrate but can be formed on limited areas on which the electroconductive lines are formed in the subsequent step of screen printing. The thickness of the solvent-absorptive layer is not particularly limitative provided that the layer has such a sufficient capacity as to fully absorb the organic solvent contained in the electroconductive paste forming lines thereon. The best way is to select the thickness experimentally after several test preparations. In particular, the thickness of the solvent-absorptive layer is in the range from 0.1 to 50 µm or, preferably, from 1.0 to 20 µm when consideration is made for a possible uneven surface condition of the layer, e.g., stains and streaks, caused by the flowing of the coating solution during the step of drying to affect the accuracy of the patterned electroconductive lines or for the loss of flexibility of the substrate required in heat-sealable connectors depending on the rigidity and thickness of the solvent-absorptive layer formed thereon.

Although it is rather preferable that the solvent-absorptive layer has very fine pits or a matted surface not to affect the accuracy of the patterned electroconductive lines to be formed thereon because these surface irregularities may contribute to enhance the absorptivity of the layer to the solvent, it is desirable that the average surface roughness of the solvent-absorptive layer does not exceed 10 µm or, preferably, 3 µm. Needless to say, care must be taken to avoid deposition or adherence of any stains or water on the surface of the solvent-absorptive layer which may greatly disturb the absorption of the solvent into the solvent-absorptive layer.

The electroconductive paste, with which an electroconductive line pattern is formed by screen printing on the surface of the solvent-absorptive layer, comprises an organic resin as a binder or the matrix phase and fine particles of an electroconductive material such as metals uniformly dispersed in the matrix phase. Various kinds of known organic resins can be used as the binder including polyvinyl chloride resins, polyvinyl acetate resins, copolymeric resins of vinyl chloride and vinyl acetate, acrylic resins, thermoplastic polyester resins, thermoplastic polyurethane resins, polybutadienes, polyimide resins, epoxy resins, alkyd resins, phenolic resins and the like without particular limitations in combination, according to need, with a curing agent suck as isocyanate compounds, amine compounds, acid anhydrides and the like. These binder resins are dissolved in a suitable organic solvent which can be selected from ester solvents, ketone solvents, ether solvents, ether ester solvents, alcohols, hydrocarbon solvents, chlorinated hydrocarbon solvents and the like exemplified by methyl acetate, ethyl acetate, isopropyl acetate, isobutyl acetate, n-butyl acetate, amyl acetate, methyl ethyl ketone, methyl isobutyl ketone, methyl isoamyl ketone, methyl n-amyl ketone, ethyl amyl ketone, diisobutyl ketone, methoxymethyl pentanone, cyclohexanone, diacetone alcohol, ethyleneglycol methyl ether acetate, ethyleneglycol ethyl ether acetate, ethyleneglycol butyl ether acetate, ethoxybutyl acetate, methyl Carbitol acetate, ethyl Carbitol acetate, butyl Carbitol acetate, trichloroethane, trichloroethylene, di-n-butyl ether, diisoamyl ether, n-butyl phenyl ether, propylene oxide, furfural, isopropyl alcohol, isobutyl alcohol, amyl alcohol, cyclohexanol, benzene, toluene, xylene, isopropyl benzene, petroleum spirit, petroleum naphtha and the like, of which preferable ones include esters, ketones and ether esters. The amount of the organic solvent in the electroconductive paste should not exceed 80% by weight or, preferably, 50% by weight in consideration of the solvent-absorptive capacity of the solvent-absorptive layer under the limitations of the thickness of the layer and molecular weight of the solvent-absorptive resin. The electroconductive paste usually has a viscosity in the range from 50 to 1000 poise and a degree of thixotropy of 2 to 15 which is the ratio of the viscosity values determined with a rotating viscometer having a rotor rotating at 20 rpm and 200 rpm.

The other essential ingredient in the electroconductive paste is a powder consisting of fine electroconductive particles having a particle diameter in the range from 0.1 to 100 μm. The particle configuration of the electroconductive particles is not particularly limitative and can be granular, flaky, plate-like, dendritic, cubic or the like. The electroconductive particles can be made from a metal such as copper, silver, gold and nickel as well as alloys of these metals. Copper particles are preferably plated with silver or gold in order to prevent oxidation. Besides particles of a metal or alloy, suitable electroconductive particles include fine particles of a plastic resin plated with a metal, carbon black, e.g., furnace black and channel black, fine particles of graphite and the like. These various kinds of electroconductive particles can be used either singly or as a combination of two kinds or more according to need. The amount of the electroconductive particles in the electroconductive paste is in the range from 10 to 90% by weight relative to the above described organic resin as the binder. It is of course optional that the electroconductive paste is compounded with various kinds of known additives including curing accelerators, levelling agents, dispersion stabilizers, antifoam agents, thixotropy-imparting agents, metal sequestering agents and the like each in a limited amount according to need.

The printing screen used for the formation of an electroconductive line pattern with the above described electroconductive paste by screen printing is a mesh sheet prepared by plain weaving or diagonal weaving from fine wires of an alloy such as stainless steel having a diameter of 10 to 40 μm or an electroformed sheet formed in a lattice-like form by plating with nickel and the like and supported by a rigid frame in a slack-free fashion. When a very fine electoconductive line pattern is desired, the mesh openings of the printing screen also must have a very small width correspondingly so that the wires forming the mesh screen should have a correspondingly small diameter consequently with a small gauze thickness of the screen. In order to ensure good penetrability of the electroconductive paste through the printing screen, it is desirable that the ratio of the width of the mesh openings to the gauze thickness is at least 0.8 or, preferably, at least 1.5. The opening ratio of the printing screen should be at least 30% or, preferably, at least 60% in order to ensure good penetration of the electroconductive paste through the printing screen. It is important here, however, not to cause a decrease in the tensile strength of the printing screen even by the use of very fine gauze wires so that the wires must have an as high as possible tensile strength relative to the diameter.

The anisotropically electroconductive adhesive applied to the heat-sealable connector of the present invention to form the anisotropically electroconductive adhesive layer 4 is not particularly limitative and can be selected depending on the intended application of the heat-sealable connector from thermoplastic and thermosetting ones. Thermoplastic adhesives are preferred when adhesive bonding should be obtained by a heating treatment at a relatively low temperature and for a relatively short time and a long pot life is desired while thermosetting adhesives are preferred when a greater adhesive bonding strength and higher heat resistance are desired than thermoplastic ones.

Examples of suitable thermoplastic adhesives include polyamide-based adhesives, polyester-based adhesives, ionomer-based adhesives and polyolefin-based adhesives, e.g., ethylene-vinyl acetate copolymeric adhesives, ethylene-methacrylic acid copolymeric adhesives, ethylene-ethyl acrylate copolymeric adhesives and the like, and various kinds of synthetic rubber-based adhesives as well as modified or composite adhesives thereof. Examples of suitable thermosetting adhesives include resinous and rubbery adhesives such as epoxy-based adhesives, urethane-based adhesives, acrylic adhesives, silicone-based adhesives, chloroprene-based adhesives, nitrile-based adhesives and the like as well as mixtures thereof. It is optional that each of these adhesives is admixed with various kinds of additives including curing agents, vulcanizing agents, controlling agents, aging retarders, heat-resistance improvers, thermal conductivity improvers, tackifiers, softening agents, coloring agents and the like each in a limited amount.

Examples of the organic solvents used for dissolving these adhesives include ester solvents, ketone solvents, ether ester solvents, ether solvents, alcoholic solvents, hydrocarbon solvents and chlorinated hydrocarbon solvents exemplified by methyl acetate, ethyl acetate, isopropyl acetate, isobutyl acetate, n-butyl acetate, amyl acetate, methyl ethyl ketone, methyl isobutyl ketone, methyl isoamyl ketone, methyl n-amyl ketone, ethyl amyl ketone, diisobutyl ketone, methoxymethyl pentanone, cyclohexanone, diacetone alcohol, ethyleneglycol methyl ether acetate, ethyleneglycol ethyl ether acetate, ethyleneglycol butyl ether acetate, methoxybutyl acetate, methyl Carbitol acetate, ethyl Carbitol acetate, dibutyl Carbitol acetate, trichloroethane, trichloroethylene, di-nbutyl ether, diisoamyl ether, n-butyl phenyl ether, propylene oxide, furfural, isopropyl alcohol, isobutyl alcohol, amyl alcohol, cyclohexanol, benzene, toluene, xylene, isopropyl benzene, petroleum spirit, petroleum naphtha and the like, of which ester solvents, ether solvents and ether ester solvents are preferred.

The electroconductive particles to impart anisotropic electroconductivity to the anisotropically electroconductive adhesive include particles of a metal or alloy such as gold, silver, copper, nickel, palladium, stainless steel, brass, solder alloys and the like, particles of an electroconductive ceramic material such as tungsten carbide, silicon carbide and the like, carbon particles, metal-coated particles of a plastic resin and so on. The particle diameter of these electroconductive particles is usually in the range from 5 to 150 μm although it should be adequately selected in consideration of the reliableness of electric connection and the permissible limit of the resistance against peeling as a consequence of the balance between the coating thickness of the anisotropically electroconductive adhesive and the connecting pitch of the electroconductive lines. The particle configuration of the electroconductive particles is not particularly limitative and can be any of spherical, acicular, flaky, plate-like, dendritic, cubic, burred spherical and irregular configurations.

The amount of these electroconductive particles compounded in the anisotropically electroconductive adhesive is in the range from 0.1 to 30 parts by volume or, preferably, from 1 to 15 parts by volume per 100 parts by volume of the resinous adhesive ingredient. When the amount of the electroconductive particles is too small, an increased chance is caused that even a single electroconductive particle does not exist between the electroconductive line and the oppositely facing electrode terminal resulting in troubles due to line break or unduly high resistance therebetween while, when the amount thereof is too large, an increased chance is caused as a matter of probability that a plural number of electroconductive particles may form a lateral sequence of the particles to decrease the anisotropy of the electroconductivity of the layer.

The method for the application of the anisotropically electroconductive adhesive is not particularly limitative and can be conventional as in the procedure for the formation of the solvent absorptive layer. The costing thickness of the anisotropically electroconductive adhesive or the thickness of the anisotropically electroconductive layer as dried should be in the range from a half to three times of the particle diameter of the electroconductive particles dispersed therein. When the thickness is too small, no sufficient adhesive bonding strength can be obtained while, when the thickness is too large, the adhesive resin intervening between the oppositely facing terminal electrodes cannot be fully extruded even under pressure so that the electroconductive particles cannot be in direct contact with both of the electrode terminals eventually to cause failure of electric connection therebetween.

It is important when the anisotropically electroconductive adhesive is directly applied to the solvent-absorptive layer that the adhesive composition should be formulated with such ingredients as not to cause erosion of the solvent-absorptive layer by deformation or dissolution. Alternatively, the composition for the solvent-absorptive layer should be formulated with such ingredients as to have resistance against the ingredients in the anisotropically electroconductive adhesive.

Figure 3:
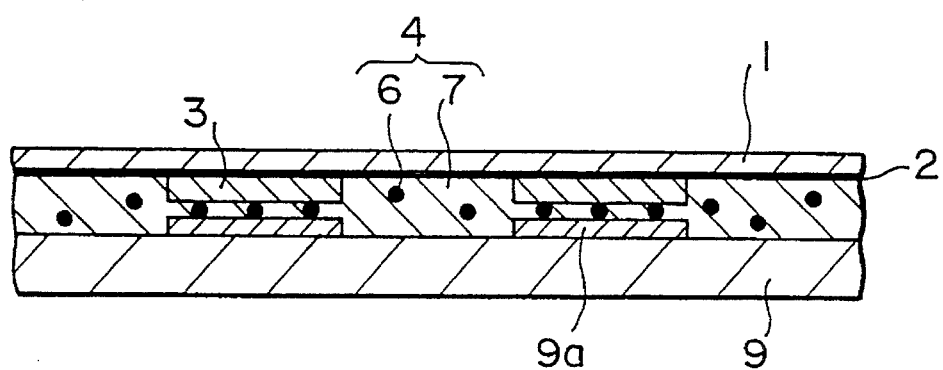
FIG. 3 illustrates, by a cross sectional view, a heat-sealable connector of the invention and a circuit board electrically connected by the connector.

FIG. 3 illustrates an assembly of the heat-sealable connector of the invention which is adhesively bonded to a circuit board to establish electric connection between the electroconductive lines on the heat-sealable connector and the electrode terminals on the circuit board. Namely, the heat-sealable connector of the invention having a substrate 1 provided with a solvent absorptive layer 2 on one surface, aligned electroconductive lines 3 formed by screen printing with an electroconductive paste and an anisotropically electroconductive adhesive layer 4 consisting of an adhesive resin 7 and electroconductive particles 6 dispersed in the adhesive layer is put on the circuit board 9 having a set of electrode terminals 9a by pressing with heating so that the heat-sealable connector is adhesively bonded to the circuit board while at least one of the electroconductive particles 6 intervenes between one of the electroconductive lines 3 and one of the electrode terminals 9a oppositely facing each other thus to establish electric connection therebetween.

When electroconductive particles and insulating particles are to be fixed on the patterned electroconductive lines, the lines are formed with the electroconductive paste admixed with the electroconductive particles and the insulating particles while it is desirable that the amount thereof to be admixed is such that the number of the particles distributed in the layer of the electroconductive lines to contribute to electrical connection is at least 20 or, preferably, at least 50 per square mm of the electroconductive lines although the particle diameter should be selected in consideration of the stability of the electrical connection and printability of the electroconductive lines using a printing screen in order to avoid possible troubles in these respects. For example, the particle diameter should be smaller than the one-side length of the lattice-like mesh openings in the gauze or sheet of the printing screen since otherwise printing with the screen is no longer possible and the particle diameter should be at least one-fifth of the thickness of the electroconductive lines since, when the particle diameter is much smaller than the thickness of the lines, stability in electrical connection is lost.

When the solvent-absorptive layer 2 is formed from a composition capable of exhibiting adhesiveness by heat sealing, it is possible to omit coating with the adhesive. In this case, electrical conduction can be obtained by the direct contacting of the electroconductive lines 3 with the electrode terminals 9a to be connected.

Thus, it is not always necessary that the heat-sealable connector is coated with the anisotropically electroconductive adhesive on all over the surface but the anisotropically electroconductive adhesive can be applied only to the connecting zone or the surface areas thereof coming into contact with the electrode terminals to be connected therewith. If desired, an insulating resist layer can be provided on appropriate areas.

The principal ingredient in the above mentioned insulating resist is a polymeric material which can be the same one as that used in the above mentioned insulating adhesive. Further, the insulating resist composition may have an adequate consistency by the addition of a suitable organic solvent which can be the same one as used in the above mentioned insulating adhesive. It is optional according to need that the insulating resist composition is admixed with various kinds of known additives including pigments, tackifiers, aging retarders, curing agents, curing catalysts, filters and the like. Coating with the insulating resist composition can be performed by a conventional method which can be the same as that used in the coating and formation of the above described solvent-absorptive layer.

In the preparation of the heat-sealable connector of the invention by the use of the above described materials, the flexible substrate material is coated with the solvent-absorptive material in the form of a solution by a known method including printing methods such as screen printing, gravure printing and the like and coating methods such as roller coating, bar coating, knife coating, spray coating and spin coating as well as dipping to form a solvent-absorptive layer on which the electroconductive lines are formed by the method of screen printing with an electroconductive paste. Thereafter, a layer of an insulating adhesive or a layer of an anisotropically electroconductive adhesive is formed by a known method on at least the areas coming into contact with the electrode terminals to be connected therewith. If necessary, a layer of an insulating resist is formed thereon to complete the heat-sealable connector of the invention.

The most characteristic feature of the heat-sealable connector of the present invention and the method for the preparation thereof consists in that a flexible substrate is first provided with a solvent-absorptive layer and the electroconductive line pattern is formed thereon by screen printing with an electroconductive paste so that the solvent contained in the electroconductive paste is instantaneously absorbed by the underlying solvent-absorptive layer. While the electroconductive pastes in the prior art used in this purpose are under limitations relative to the content of organic solvents and viscosity in order to avoid running and blotting of the electroconductive paste and cannot be used in the patterning work to form very fine electroconductive lines in respect of the penetrability of the electroconductive paste through the printing screen, these problems can be solved by virtue of the solvent-absorptive layer so that patterning of any finest electroconductive lines can be performed by screen printing. Further, since the electroconductive paste is freed from the above mentioned limitations relative to the content of solvents and viscosity, great versatility can be obtained relative to the conditions in the manufacturing process of heat-sealable connectors which can be manufactured with good stability and high productivity. In addition, to downsizing correction is required in the width of the mesh openings in the printing screen, which is indispensable in the prior art in consideration of running of the electroconductive paste to cause broadening of the printed line contributing to obtain freer and finer patterning of the electroconductive lines. The improvement in this regard is more advantageous when the electroconductive paste is compounded with electroconductive and/or insulating particles coarser than the electroconductive particles inherently contained in the electroconductive paste. Furthermore, the electroconductive lines of the electroconductive paste can be formed on the surface of the solvent-absorptive layer with a higher anchoring effect than on the surface of a flexible substrate as such or the electroconductive lines are bonded more firmly to the surface of the solvent-absorptive layer by forming a chemical bonding with the solvent-absorptive material resulting in an improvement in the printability of the electroconductive lines and stability of the electrical connection therewith as well as flexibility of the heat-sealable connector.

In the following, the heat-sealable connector of the present invention and the method for the preparation thereof are described in more detail by way of examples, which, however, never limit the scope of the invention in any way.

Following is a characterizing description of the various materials used in the examples and comparative examples for the preparation of the heat-sealable connectors.

Solvent-absorptive material I

A solution of 80% by weight solid content was prepared by dissolving, in toluene, a saturated copolymeric polyester resin (Bailon 103, a product by Toyoho Co.) having a molecular weight of 20000 to 25000, glass transition point of 47° C., hydroxyl value of 6.0 mg KOH/g, acid value of 1.0 mg KOH/g and solubility parameter of 9.2 and the solution was admixed with a block isocyanate compound having a solid content of 80% and a content of isocyanate of 10.2% by weight (Coronate 2513, a product by Nippon Polyurethane Co.) in such an equivalent amount to the active hydrogen atoms in the above mentioned saturated copolymeric polyester resin give a uniform solution which was further admixed with 0.1% of triethylene diamine as a curing accelerator.

Solvent-absorptive material II

The formulation was the same as in the solvent-absorptive material I described above except that the amount of the block isocyanate compound was 70% of the equivalent amount to the active hydrogen atoms in the saturated copolymeric polyester resin.

Solvent-absorptive material III

It was a 80% by weight toluene solution of another saturated copolymeric polyester resin (Bailon 290, a product by Toyoho Co.) having a molecular weight of 20000 to 25000, glass transition point of 72° C., hydroxyl value of 6.0 mg KOH/g, acid value of 1.0 mg KOH/g and solubility parameter of 9.1.

Solvent-absorptive material IV

It was a 80% by weight toluene solution of a combination of 100 parts by weight of a styrene-based thermoplastic elastomer having a solubility parameter of 8.7 (Crayton G1652, a product by Shell Chemical Co.) and 50 parts by weight of a coumarone indene resin (LX-509, a product by Nippre Co.).

Substrate for printing I

A flexible polyethylene terephthalate film having a thickness of 25 µm (Lumirror S-10, a product by Toray Inc.) was coated on one surface all over with the above described solvent-absorptive material I by using a kiss-roll coater in a coating amount to give a dried coating layer having a thickness of 2 µm followed by drying in an infrared drying oven.

Substrate for printing II

The same polyethylene terephthalate film as in substrate for printing I was coated with the solvent-absorptive material II also in the same coating thickness.

Substrate for printing III

The same polyethylene terephthalate film as in substrate for printing I was coated with the solvent-absorptive material III also in the same coating thickness, Substrate for printing IV The same polyethylene terephthalate film as in substrate for printing I was coated with the solvent-absorptive material IV also in the same coating thickness.

Substrate for printing V

The same polyethylene terephthalate film as in substrate for printing I was coated with the solvent-absorptive material I but the coating thickness was 0.3 µm instead of 2 µm.

Substrate for printing VI

This substrate was the same as the substrate for printing I described above except that the coating solution of the solvent-absorptive material I was admixed with 1 part by weight of particles of a silicone resin having a particle diameter of 3 µm per 100 parts by weight thereof.

Substrate for printing VII

The same polyethylene terephthalate film as in the substrate for printing I was coated with the solvent-absorptive material I but the coating thickness was 80 µm instead of 2 µm.

Substrate for printing VIII

The same polyethylene terephthalate film as in the substrate for printing I was used as such without coating with any solvent-absorptive material.

Electroconductive paste I

The same saturated copolymeric polyester resin as used for the solvent-absorptive material I (Bailon 103) was admixed with the same amount of the same block isocyanate compound as for the solvent-absorptive material I and this mixture, which served as the organic binder, was admixed with flaky silver particles having a particle diameter of 1 to 3 µm and diluted by the addition of ethyl Carbitol acetate as the solvent. The content of the solvent therein was 20% and the paste had a viscosity of 160 poise at 25° C. as measured by a rotation viscosimeter and a degree of thixotropy of 3.8 as a ratio of the apparent viscosity values measured with a rotation viscosimeter at 20 rpm and 200 rpm of the rotor.

Electroconductive paste II

The same saturated copolymeric polyester resin as used for the solvent-absorptive material I (Bailon 103) was admixed with the same amount of the same block isocyanate compound as for the solvent-absorptive material II and this mixture, which served as the organic binder, was admixed with flaky silver particles having a particle diameter of 1 to 3 μm and diluted by the addition of ethyl Carbitol acetate as the solvent. The content of the solvent therein was 20% and the paste had a viscosity of 160 poise at 25° C. as measured by a rotation viscosimeter and a degree of thixotropy of 3.8.

Electroconductive paste III

The electroconductive paste I was further admixed, per 100 parts by weight thereof, with 5 parts by weight of nickel particles of 30 μm particle diameter having a dendritic particle configuration.

Electroconductive paste IV

The electroconductive paste I was further admixed, per 100 parts by weight thereof, with 5 parts by weight of particles of a polystyrene resin of 30 μm particle diameter having a porous surface.

Printing screen I

Figure 4:
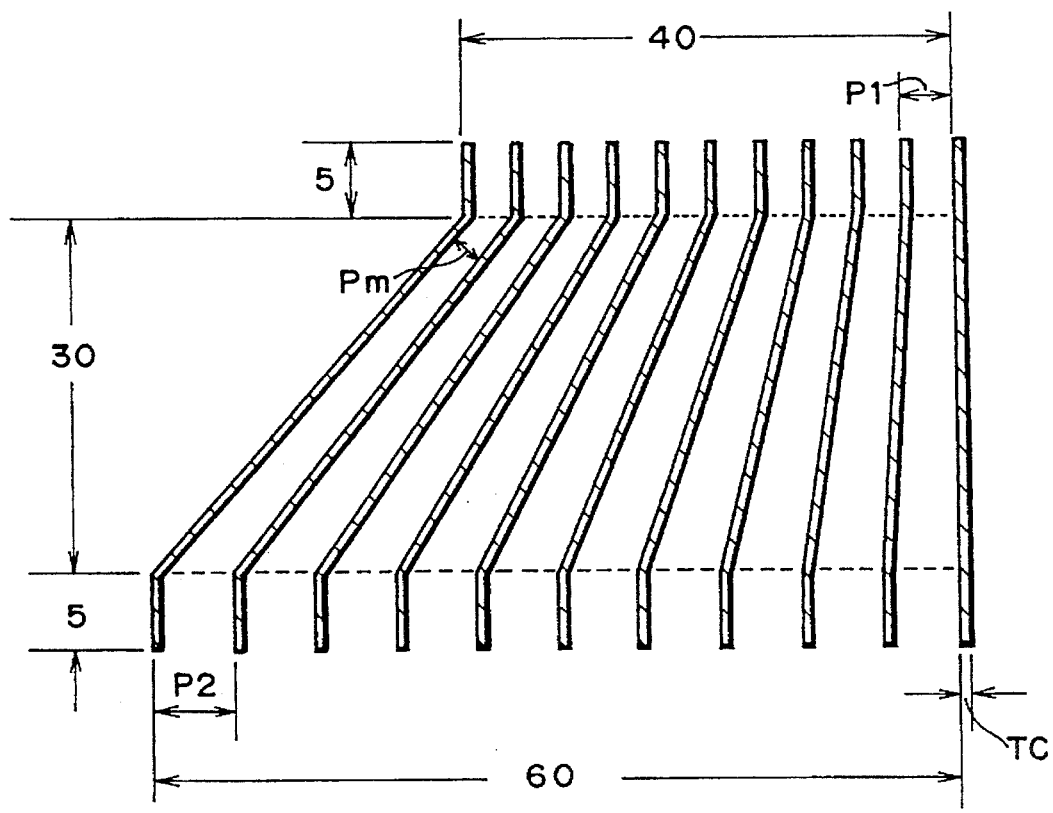
FIG. 4 shows the pattern of screen-printed electroconductive lines for the test preparation of connectors in the Examples.

A screen made from stainless steel wires of 27 μm diameter having a gauze thickness of 54 μm and a mesh opening ratio of 43% was provided with a pattern for electroconductive lines illustrated in FIG. 4 in which P1=0.2 mm, P2:0.8 mm, TC=0.1 mm and Pm=0.17 mm.

Printing screen II

A screen made from stainless steel wires of 27 μm diameter having a gauze thickness of 54 μm and a mesh opening ratio of 43% was provided with a pattern for electroconductive lines illustrated in FIG. 4 in which P1=0.2 mm, P2=0.3 mm, TC=0.06 mm and Pm=0.17 mm.

Example 1

Screen printing was conducted by using the substrate for printing I, electroconductive paste I and printing screen I and the thus printed substrate was heated first for 3 minutes in an infrared drying oven, in which the surface temperature of the substrate could reach 140° C., and then for 5 hours in a hot-air drying oven at 120° C. to effect curing of the paste.

Separately, an anisotropically electroconductive adhesive was prepared by dissolving or dispersing 100 parts by weight of a saturated copolymeric polyester resin (Bailon 300, a product by Toyobo Co.), 10 parts by weight of an isocyanate compound (Coronate L, a product by Nippon Polyurethane Co.) and 50 parts by weight of titanium dioxide in 240 parts by weight of ethyleneglycol monoacetate and compounding the solution with nickel- and gold-plated particles of a polystyrene resin having a particle diameter of 20 μm. This anisotropically electroconductive adhesive was applied to the above obtained printed substrate after the heat treatment on the connecting areas by screen printing followed by drying while the remaining areas were coated with an insulating resist ink (SR-610, a product by Toyobo Co.) to give a completed heat-sealable connector provided with a resist layer. The condition of the screen-printed electroconductive lines was quite sharp without any defects.

Example 2

A second heat-sealable connector was prepared in the same manner as in Example 1 excepting replacement of the substrate for printing I with the substrate for printing II and the electroconductive paste I with the electroconductive paste II. The condition of the screen-printed electroconductive lines was quite sharp without any defects.

Example 3

A third heat-sealable connector was prepared in the same manner as in Example 1 excepting replacement of the substrate for printing I with the substrate for printing III. The condition of the screen-printed electroconductive lines was quite sharp without any defects.

Example 4

A fourth heat-sealable connector was prepared in the same manner as in Example 1 excepting replacement of the substrate for printing I with the substrate for printing IV. The condition of the screen-printed electroconductive lines was quite sharp without any defects.

Example 5

A fifth heat-sealable connector was prepared in the same manner as in Example 1 excepting replacement of the substrate for printing I with the substrate for printing VI. The condition of the screen-printed electroconductive lines was quite sharp without any defects.

Example 6

A sixth heat-sealable connector was prepared in the same manner as in Example 1 excepting replacement of the electroconductive paste I with the electroconductive paste III. The condition of the screen-printed electroconductive lines was quite sharp without any defects.

Example 7

A seventh heat-sealable connector was prepared in the same manner as in Example 1 excepting replacement of the electroconductive paste I with the electroconductive paste IV. The condition of the screen-printed electroconductive lines was quite sharp without any defects.

Comparative Example 1

An eighth heat-sealable connector was prepared in the same manner as in Example 1 excepting replacement of the substrate for printing I with the substrate for printing VIII. Short circuiting between the screen-printed electroconductive lines due to running of the paste was found from place to place all over the connector.

Comparative Example 2

A ninth heat-sealable connector was prepared in the same manner as in Example 1 excepting replacement of the substrate for printing I with the substrate for printing VIII and the printing screen I with the printing screen II. Remarkable line break was found in the screen-printed electroconductive lines.

Comparative Example 3

A tenth heat-sealable connector was prepared in the same manner as in Example 1 excepting replacement of the substrate for printing I with the substrate for printing VIII, the electroconductive paste I with the electroconductive paste III and the printing screen I with the printing screen II. Remarkable line break was found in the screen-printed electroconductive lines.

Comparative Example 4

An eleventh heat-sealable connector was prepared in the same manner as in Example 1 excepting replacement of the substrate for printing I with the substrate for printing VIII, the electroconductive paste I with the electroconductive paste IV and the printing screen I with the printing screen II. Remarkable line break was found in the screen-printed electroconductive lines.

Comparative Example 5

A twelfth heat-sealable connector was prepared in the same manner as in Example 1 excepting replacement of the substrate for printing I with the substrate for printing V. Remarkable line break was found in the screen-printed electroconductive lines.

Comparative Example 6

A thirteenth heat-sealable connector was prepared in the same manner as in Example 1 excepting replacement of the substrate for printing I with the substrate for printing VII. Distortion was found in the alignment of the screen-printed electroconductive lines.

The 13 heat-sealable connectors prepared in the Examples and Comparative Examples were each subjected to the evaluation tests for the items shown below each in the procedure described there. The results of these evaluation tests are shown in the tables below.

1. Line width

The width of 100 electroconductive lines printed on the solvent-absorptive layer was measured by using a measuring microscope and the results were recorded in μm as an average of the 100 values.

2. Line condition

The electroconductive lines printed on the solvent-absorptive layer were visually and microscopically examined to detect any defects such as distortion, line break, short-circuiting, running and blotting.

3. Line condition after heat sealing

The heat-sealable connector was bonded at the connecting zone by heat sealing to a printed circuit board having an array of electrode terminals with approximately the same pitch and line width as the connector under a pressure of 30 kgf/cm$^2$ at a temperature of 140° C. and the condition of the electroconductive lines was visually and microscopically examined.

4. Resistance against bending (adhesive strength)

The heat-sealable connector was bonded at the connecting zone by heat sealing to a printed circuit board having an array of electrode terminals with approximately the same pitch and line width as the connector and then kept as folded by an angle of 180° for 1 minute under a pressure of 50 gf/cm$^2$. Thereafter, it was zigzag folded to make five crest lines and five bottom lines followed by the measurement of the increment in the electric resistance in %.

5. Yield of acceptable products 100 shots of screen printing of the electroconductive line pattern were conducted and the thus obtained electroconductive line patterns were electrically tested to detect line break or short-circuiting. Record was made of the percentage of acceptable products without these defects.

6. Ambience characteristics

Each of the heat-sealable connectors was bonded by heat sealing to a PCB and an ITO, each having approximately the same pitch and line width, therebetween and kept standing in an atmosphere of 85% relative humidity at 85° C. for 500 hours to determine the increment % in the electric resistance from the initial value.

TABLE

| | Line width, mm | Condition after heat sealing | Bending resistance, % | Yield % | Increment in resistance, % |
|---|---|---|---|---|---|
| Example 1 | 0.1004 | good | 13.6 | 100 | 2.5 |
| Example 2 | 0.1009 | good | 15.9 | 100 | 1.2 |
| Example 3 | 0.1007 | good | 18.9 | 100 | 2.8 |
| Example 4 | 0.1099 | good | 14.1 | 100 | 2.9 |
| Example 5 | 0.1007 | good | 16.5 | 100 | 2.5 |
| Example 6 | 0.1008 | good | 30.1 | 100 | 3.2 |
| Example 7 | 0.1004 | good | 15.8 | 100 | 2.0 |
| Comparative Example 1 | 0.1546 | — | — | 0 | — |
| Comparative Example 2 | 0.1030 | good | line break | 2 | 10.9 |
| Comparative Example 3 | 0.1035 | — | — | 0 | — |
| Comparative Example 4 | 0.1039 | — | — | 0 | — |
| Comparative Example 5 | 0.1250 | good | 14.6 | 10 | 5.2 |
| Comparative Example 6 | 0.1002 | line break distortion | 15.3 | 92 | 12.3 |

What is claimed is:

1. A heat-sealable connector which comprises, as an integral body:

(a) a substrate;

(b) a layer of a solvent-absorptive material formed on at least a part of the surface of the substrate, said solvent-absorptive material being capable for absorbing an organic solvent contained in a subsequently applied electroconductive paste;

(c) lines of an electroconductive paste aligned substantially in parallel to each other or the layer of the solvent-absorptive material; and (d) a layer of a heat-sealable, anisotropically electroconductive adhesive formed on the lines of the electroconductive paste.

2. The heat-sealable connector as claimed in claim 1 in which the layer of the solvent-absorptive material has a thickness in the range from 0.1 to 50 μm.

3. The heat-sealable connector as claimed in claim 1 in which the layer of the solvent-absorptive material is an electrically insulating organic polymer which is a reaction product of an organic compound having an active hydrogen atom in the molecule and an isocyanate compound.

4. The heat-sealable connector as claimed in claim 1 in which the layer of the solvent-absorptive material contains particles of an electrically insulating material having a particle diameter in the range from 0.01 to 10 μm dispersed therein.

5. The heat-sealable connector as claimed in claim 4 in which the amount of the particles of the electrically insulating material is in the range from 0.1 to 10 parts by weight per 100 parts by weight of the solvent-absorptive material.

6. The heat-sealable connector as claimed in claim 1 in which the lines of an electroconductive paste are aligned with a space between two adjacent lines having a width in the range from 0.03 to 0.6 mm.

7. The heat-sealable connector of claim 1 wherein the solvent-absorptive material is selected from the group consisting of polyvinyl chloride resins, polyvinyl acetate resins, copolymers of vinyl chloride and vinyl acetate, polystyrene resins, acrylic resins, thermoplastic polyester resins, thermoplastic polyurethanes, polybutadienes, polyvinyl alcohols, polyvinyl butyral resins, polycarbonate resins, polyamide resins, polyimide resins, epoxy resins, alkyd resins, phenolic resins, polyisobutylene rubbers, polybutadiene rubbers, butylrubbers, styrenebutadiene copolymeric rubbers, butadiene-acrylonitrile copolymeric rubbers, and thermoplastic elastomers based on styrene, polyester, or urethane.

8. The heat-sealable connector of claim 1 wherein the electroconductive paste comprises an organic resin as a binder and fine particles of an electroconductive material uniformly dispersed in the binder.

9. The heat-sealable connector of claim 8 wherein the binder is selected from the group consisting of polyvinyl chloride resins, polyvinyl acetate resins, copolymeric resins of vinyl chloride and vinyl acetate, acrylic resins, thermoplastic polyester resins, thermoplastic polyurethane resins, polybutadienes, polyimide resins, epoxy resins, alkyd resins, and phenolic resins.

10. The heat-sealable connector of claim 8 wherein the electroconductive material is in the form of particles having a particle diameter in the range from 0.1 to 100 μm.

11. The heat-sealable connector of claim 8 wherein the particles are selected from the group consisting of copper, silver, gold, nickel, and alloys thereof.

12. The heat-sealable connector of claim 8 wherein the particles are selected from the group consisting of plastic resin plated with a metal, carbon black, furnace black, channel black, and graphite.

13. The heat-sealable connector of claim 1 wherein the anisotropically electroconductive adhesive is selected from the group consisting of polyamide-based adhesives, polyester-based adhesives, ionomer-based adhesives and polyolefin-based adhesives.

* * * * *